United States Patent [19]

Karasawa

[11] Patent Number: 4,893,156
[45] Date of Patent: Jan. 9, 1990

[54] MOS FET DEVICE
[75] Inventor: Shinji Karasawa, Matori, Japan
[73] Assignee: Miyage National College of Technology, Miyagi, Japan
[21] Appl. No.: 165,077
[22] Filed: Mar. 7, 1988
[30] Foreign Application Priority Data
  May 28, 1987 [JP] Japan ............................... 62-129872
[51] Int. Cl.⁴ ...................... H01L 29/78; H01L 29/06
[52] U.S. Cl. .................................... 357/23.1; 357/20; 357/23.3
[58] Field of Search ..................... 357/23.1, 20, 23.3
[56] References Cited
  U.S. PATENT DOCUMENTS
  2,994,811  8/1961  Senitzky .......................... 357/23.1
  3,321,680  5/1967  Arndt et al. ...................... 357/23.1
  3,593,071  7/1971  Janning ........................... 357/23.1
  3,836,993  9/1974  Jashi ............................. 357/22 R
  4,025,940  5/1977  Kimura et al. .................... 357/23.14

Primary Examiner—Eugene R. Laroche
Assistant Examiner—Michael Shingleton
Attorney, Agent, or Firm—Stevens, Davis, Miller & Mosher

[57] ABSTRACT

The disclosed MOS FET device has a semiconductor substrate of for instance n-type, on which a drain zone of for instance p-type and a source zone of for instance p-type are formed with a channel zone disposed therebetween. An insulating thin film is disposed on the channel zone and a gate electrode is formed on the insulating film so as to face the channel zone across the film. At least one of drain zone and the source zone has a tapered portion whose diminished edge extends into the channel zone so as to face the other one of the drain and source zones.

11 Claims, 6 Drawing Sheets

FIG_5

FIG_6

FIG_7A

FIG_7B

FIG_7C

FIG_7D

FIG_7E

MOS FET DEVICE

BACKGROUND OF THE INVENTION

1. Field of the Invention

This invention relates to a metal-oxide-semiconductor field-effect transistor (MOS FET) device, and more particularly the invention relates to a MOS FET device whose output drain current varies in proportion to its control gate voltage.

2. Description of the Prior Art

In various digital circuits, MOS FET is widely used, and it is now one of the major digital circuit elements. Since MOS FET can function as an amplifier, it is also used in linear electronic circuits. For instance, it is used as an amplifying element in sensor-semiconductor assemblies such as MOS strain gauges and MOS pressure sensors, and it is also used in control linear electronic circuits such as low resistance loads and inductive loads.

A typical conventional MOS FET has a rectangular source zone and a rectangular drain zone which are disposed so as to face each other, and a gate insulating film is formed between the source zone and the drain zone so that a gate electrode formed on the insulating film extends its electrical field to a current channel between the source zone and the drain zone. The output drain current is controlled by a voltage applied to the gate electrode. Such conventional MOS FET has a shortcoming in that the output drain current varies as quadratic function of the control gate voltage, so that when the MOS FET is used as an amplifying element, its output must be converted into a linear quantity. In this case it is necessary to use a separate converter circuit for changing the output into a linear quantity.

The need of the separate converter for linearization of the output drain current tends to complicate the signal processing circuits and to increase the production cost. Another shortcoming of the conventional MOS FET is in that, when it is used as a control linear circuit element such as a low resistance load or an inductive load, the drain current is susceptible to sudden change in case of relatively minor change in power source voltage, because it increases as a quadratic function of the control gate voltage.

SUMMARY OF THE INVENTION

Therefore, an object of the present invention is to solve the above-mentioned shortcoming of the prior art by providing an improved MOS FET device. The MOS FET device of the invention provides an output which varies linearly with the control gate voltage.

MOS FET device according to the invention uses a semiconductor substrate of for instance p-type, and a source zone of for instance n-type and a drain zone of for instance n-type are formed on the substrate with a gap therebetween. Separate electrodes are applied on the source zone and the drain zone respectively Insulating layers are overlaid on the drain zone and the source zone. A channel zone is defined by a gap on the substrate so as to lie between the source region and the drain region, and an insulating film is overlaid on the channel zone and connects both sides of the insulating layers provided on the drain zone and the source zone so as to form a recessed portion between the insulating layers. Further, a gate electrode is formed on the insulating film so as to overlie the channel region. At least either one of the source zone and the drain zone has a tapered portion whose diminished edge focus the other of the source and drain zones across the gap.

When at least one of the facing portions of the source zone and the drain zone is tapered, for instance in the form of wedge, semicircle or semi-ellipse, the electric field in the channel region is rapidly intensified in the vicinity of the diminished end of such tapered portion. At the same time, an almost concentric circular electric field is produced in the proximity thereof with a center at about the middle point of the facing ends of the source and drain zones. In the proximity of the above middle point, the electric field is so intensified that the carrier moving speed is saturated. As a result, a current component which is proportional to the gate voltage increases. In the area where the concentric electric field is produced, diffusion currents are injected in lateral direction, and since such diffusion currents are proportional to the gate voltage, the total current proportional to the gate voltage increases correspondingly. Due to the above mentioned electric field intensifying effect and the diffusion current injecting effect, one can obtain an output drain current which is substantially proportional to the gate voltage.

BRIEF DESCRIPTION OF THE DRAWING

For a better understanding of the invention, reference is made to the accompanying drawing, in which.

Throughout different views of the drawing, 1 is a semiconductor substrate, 2 is a drain zone, 2a is a drain electrode, 2b and 3b are tapered portions, 2c and 3c are diminished edges, 3 is a source zone, 3a is a source electrode, 4 is an insulating layer, 4a is an insulating film, 5 is a gate electrode, and 6 is a channel region.

DESCRIPTION OF PREFERRED EMBODIMENTS

Figure 1A:
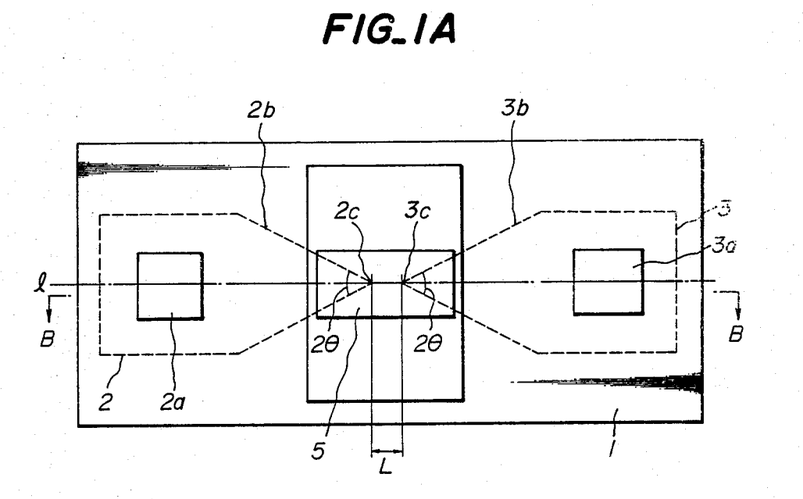
FIG. 1A is a schematic plan view of an embodiment of the MOS FET device according to the invention.
Figure 1B:
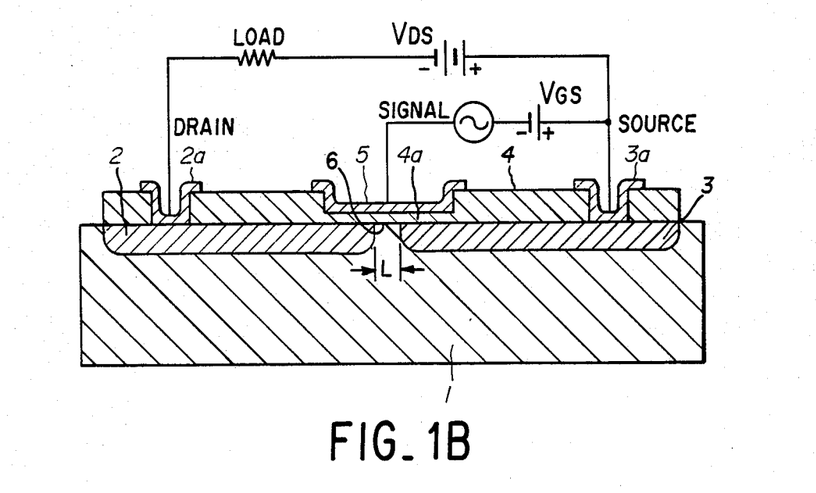
FIG. 1B is a schematic sectional view taken along the line B—B of FIG. 1.

Referring to the schematic plan view of the MOS FET device of invention in FIG. 1A and its schematic sectional view in FIG. 1B, a semiconductor substrate 1 is made of for instance n-type silicon. A drain zone 2 of for instance p-type and a source zone 3 of similar p-type are formed in the semiconductor substrate 1 by boron diffusion. The drain zone 2 and the source zone 3 of the embodiment have such tapered portions 2b and, 3b that one extend toward the other. The tapered portions 2b, 3b can be of wedge shape. A channel zone is defined by a gap in that part of the substrate where the drain zone 2 and the source zone 3 face each other, so that the zones 2 and 3 are separated by the channel region 6. An insulating layer 4, such as an $SiO_2$ layer, is formed on the drain zone 2 and the source zone 3, while an insulating film 4a is overlaid on the channel region and connecting both sides of insulating layer 4. A gate electrode 5 is overlaid on the insulating film 4a with a recessed portion so as to overlie the channel region.

A drain electrode 2a and a source electrode 3a, which can be made of aluminum, are formed on the drain zone 2 and the source zone 3 respectively. In the illustrated embodiment, the drain zone 2 and the source zone 3 are of identical shape, and tapered portions 2b and 3b of wedge shape are formed on the facing portions of the drain zone 2 and the source zone 3 respective. The wedge-like tapered portions 2b and 3b are of identical isosceles triangle with a vertical angle $2\theta = 20°$. A gap L of 10 μm is provided between the diminished edge 2c of the tapered portion 2b of the drain zone 2 and the diminished edge 3c of the tapered portion 3b of the source zone 3, so as to facilitate formation of such an electric field that carrier moving speed in the channel zone is saturated in the proximity of the threshold voltage ($V_t$). A 75 μm wide gate electrode 5 is overlaid on the insulating film 4a so as to cover a part of the tapered portions 2b and 3b.

With the above formation, an intensified electric field is produced between the diminished edges 2c and 3c, while a substantially concentric circular electric field with a center at about the middle of the two edges is produced between the drain zone 2 and the source zone 3. As a result, the electric field between the source and drain in this embodiment converges at the central portion where the edges 2c and 3c are, and the electric field at portions away from such edges 2c, 3c has two components; namely, a component parallel to the channel zone and a component perpendicular to the channel zone. Such electric field in this embodiment is different from that of the conventional MOS FET.

The process of making a MOS FET device of the invention will be described now. An oxide coating for photoetching is formed on the silicon substrate 1 by oxidation process, and windows for boron diffusion are bored therethrough. The drain zone 2 and the source zone 3 consisting of boron diffused layers are formed by boron deposition in a furnace, oxidation process, and inplantation of boron process. An insulating layer 4 is formed by using $SiO_2$, and a 770 Å thick gate insulating film 4a is made on the upper surface of the channel zone by photoetching and dry oxidation at 1,000° C. for 60 minutes. Then, a drain electrode 2a and a source electrode 3a are made by boring contact holes through the insulating layer 4 both at the drain zone and at the source zone, vacuum evaporation, and photoetching. The dimensional accuracy in the production of the MOS FET device depends on the accuracy of a photo mask to be used. If dimensional accuracy in the order of about 1 μm is ensured, a satisfactory MOS FET device with excellent performance can be produced.

Figure 2:
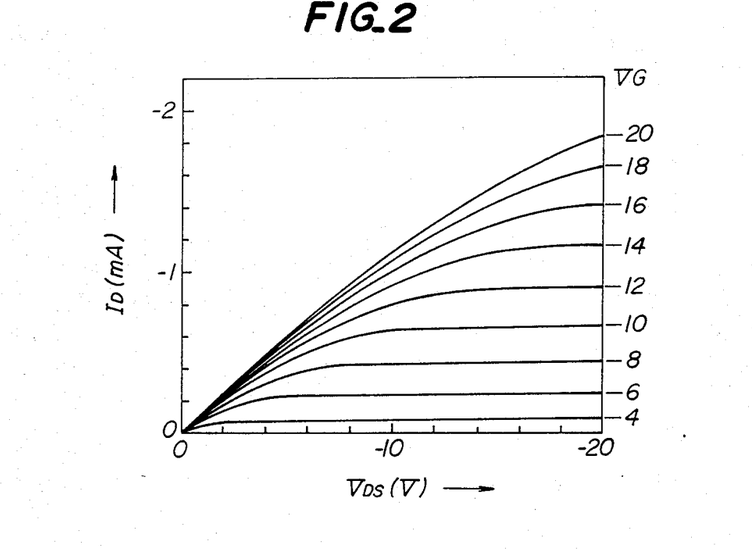
FIG. 2 is a graph showing the voltage-current characteristics of the MOS FET device of the invention on linear scales.

The output current characteristics of the MOS FET device thus produced will be described now. The drain current versus source-drain voltage characteristics at different gate voltages is shown on linear scale in FIG. 2, in which the abscissa represents the source-drain voltage $V_{DS}$ and the ordinate represents the drain current $I_D$. As can be seen from FIG. 2, the MOS FET device of the invention differs from the conventional MOS FET in that the absolute value of the drain current $I_D$ increases linearly with the increase of the source-drain voltage $V_{DS}$ at each gate voltage.

Figure 3A:
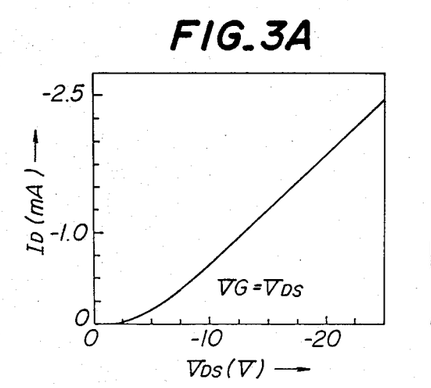
FIG. 3A is a graph showing the voltage-current characteristics of the MOS FET device for a specific gate voltage.
Figure 3B:
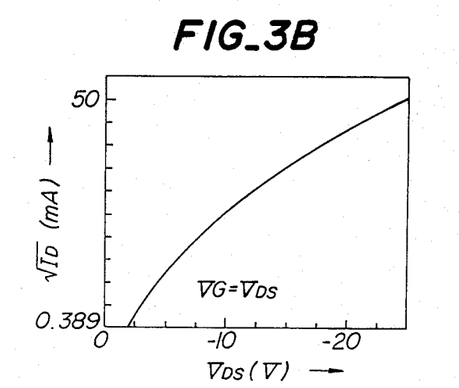
FIG. 3B is a graph similar to that of FIG. 3A except that the current is on a square root scale.

To further clarify this characteristics, FIG. 3A and FIG. 3B show the voltage-current characteristics of the MOS FET device when it is connected as a load MOS. In FIG. 3A, the abscissa represents the source-drain voltage $V_{DS}$ and the ordinate represents the drain current $I_D$. The drain current $I_D$ shown in this graph varies as a linear function of the SOurCe drain voltage $V_{DS}$. FIG. 3B shows the same characteristics while using the ordinate representing the square root of the drain current $\sqrt{I_D}$. As can be seen from FIG. 3A, when the MOS FET device is connected as a load MOS, the saturated drain current varies almost linearly with the gate voltage for the gate voltage below $-6$ V. On the other hand, in FIG. 3B using the ordinate representing $\sqrt{I_D}$, the quantity $\sqrt{I_D}$ is not linear with respect to the source-drain voltage $V_{DS}$ but rather linear with its square root. Based on the above result, the MOS FET device of the invention has been proved to produce an output current which varies linearly with the gate voltage.

Figure 4:
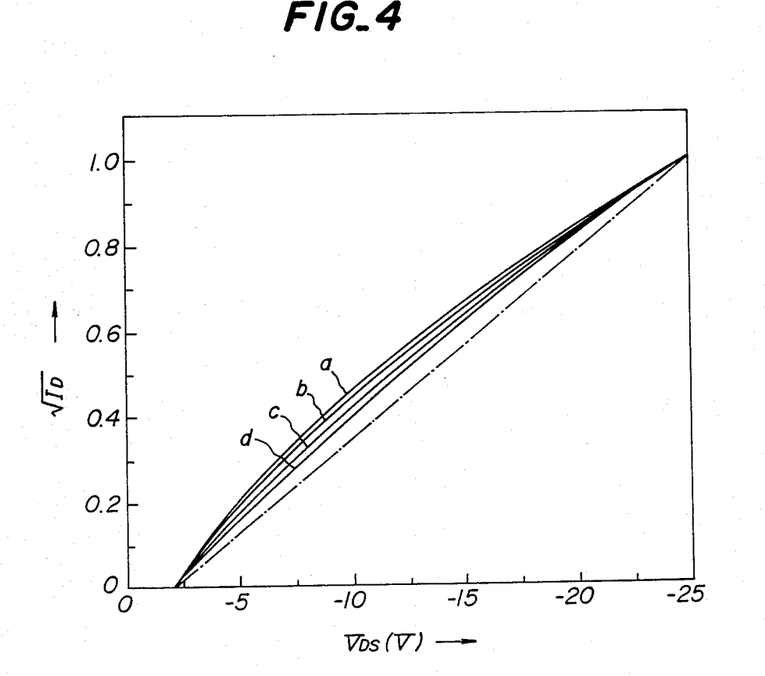
FIG. 4 is a graph showing the voltage-current characteristics of the MOS FET device for different combinations of the vertical angles of tapered portions and the gaps L between the diminished edges of tapered portions.

FIG. 4 shows the voltage-current characteristics for different combinations of the edge-to-edge gaps L and the vertical angle $2\theta$ of the tapered portion. To check the effect of the edge-to-edge gap and the vertical angle on the performance of the MOS FET device of the invention, the inventors prepared specimens having various vertical angles and various edge-to-edge gaps and measured their voltage-current characteristics. FIG. 4 shows typical examples of the measured values. In the measurement, each specimen of the MOS FET device was connected as a MOS load, and the dependency of the saturated drain current on the voltage was checked. The abscissa of FIG. 4 represents the source drain voltage $V_{DS}$, while the ordinate represents the square root of the drain current $\sqrt{I_D}$. To facilitate the comparison of the rate of increase of the current, each current value was normalized for the gate voltage $V_D = -25$ V. The dimensional conditions of the curves a, b, c, and d of FIG. 4 were as follows:

curve a: L=20 μm, $2\theta = 7°$
curve b: L=20 μm, $2\theta = 106°$
curve c: L=100 μm, $2\theta = 8°$
curve d: L=100 μm, $2\theta = 174°$ The dash-dot line of FIG. 4 is a reference line which corresponds to the linearity between the quantities $\sqrt{I_D}$ and $V_{DS}$. In FIG. 4, the distances from the curves a, b, c, and d to the reference line decrease in that order; namely, distance from the curve a to the reference line is the largest and the distance from the curve d to the reference line is the smallest. Thus, the linearity between the drain Current $I_D$ and the source-drain voltage $V_{DS}$ of the curves a, b, c, and d decreases in that order; namely, the above linearity of the curve a is the strongest, while the above linearity of the curve d is the weakest. Thus, the above linearity becomes stronger as the edge-to-edge gap L decreases and as the vertical angle decreases. Judging from the result of the above measurement, satisfactory and practicable linear characteristics can be obtained with the vertical angle in a range of 10° to 160°.

The characteristics of the MOS FET device of the invention will be analyzed now. The reasons for the linearity between the saturated drain current and the source-drain voltage $V_{DS}$ as shown in FIG. 4 appears to be in the effect of the vertical angles and the local electric field intensifying effect between the diminished ends of the tapered portions. When the mutually facing parts of the drain zone and the source zone are tapered, preferably into wedge shape, the electric field converges at the diminished edge of the tapered portion, and the electric field away from the diminished edge gradually decreases with the vertical distance from the channel zone. Thus, the electric field concentrates at about the middle of the diminished edges to as to strongly accelerate the carriers and to produce a high current density there.

In fact, the electric field in the proximity of the diminished edge of the tapered portion becomes about $10^5$ V/m under the voltage of about its threshold value. Generally speaking, hole carriers injected into silicon move at about a saturated constant speed when the intense electric field of about $10^5$ to $10^7$ V/m is applied thereto. In this case, only that amount of carriers which is balanced with the gate voltage contributes to the conduction, and even if avalanche occurs in the channel region, the current does not increase. Thus, carriers at a density proportional to the gate voltage move at a constant speed. Accordingly, at the middle portion between the diminished edges where the current density is high, a current proportional to the gate voltage appears. The above-mentioned embodiment refers to a p-type MOS FET whose carriers are holes, so that a clear-cut linearity is produced.

Further, the presence of the electric field perpendicular to the channel between the drain zone and the source zone (lateral electric field component) seems to have the following effects.

(a) The lateral electric field component tends to converge the carriers at the diminished edge of the tapered portion and to spread the channel in the lateral direction.

(b) In the saturation range of the drain current, the extension of the pinch-off zone in the proximity of the drain zone is proportional to the square root of the source-drain voltage $V_{DS}$, so that the channel is deformed by a degree corresponding to the vertical angle of the diminished edge.

(c) Due to shortage of carriers on the drain side of the channel between the edges relative to the middle point thereof, a diffusion current of peripheral carriers is caused.

The effects of the above paragraphs (a) and (b) are to reduce the carrier density in the channel between the edges, but the diffusion current is proportional of the gate voltage, and due to an increase of the diffusion current, an increase of the drain current in proportion to the gate voltage can be effected. Thus, the characteristics of the MOS FET device of the invention seems to be caused by a combination of the electric field converging effect and the effect of producing the electric field component perpendicular to the channel in the space between the source and the drain.

This effect of propertionality to the gate voltage will be explained by mathematical equation now. The above effect can be expressed by the following equation (1), provided that a constant independent of current is represented by $\beta_A$.

$$I_{DA} = \beta_A(V_G - V_T) \quad (1)$$

here, $I_{DA}$ is the drain current when the carrier density is proportional to the gate voltage, $V_G$ is the gate voltage, and $V_T$ is the threshold Voltage.

When the avalanche effect is not present, the drain current $I_D$ has the following conventional characteristics as shown by the equation (2).

$$I_{DN} = \beta_N\{(V_G - V_T)V_d - V_D(V_D/2)\} \quad (2)$$

here, $\beta_N$ is a constant depending on the gate structure and $V_D$ is the drain voltage. As a whole, the total current $I_{DT}$ is the sum of the above current $I_{DA}$ and $I_{DN}$ as can be given by the following equation (3).

$$I_{DT} = I_{DA} + I_{DN} \quad (3)$$

That drain voltage $V_{DS}$ which gives the saturation of the above $I_{DN}$ depends on the gate voltage as expressed by the following equation.

$$V_{DS} = V_G - V_T \quad (4)$$

That voltage $V_{DS}'$ which gives the apparent saturation can be derived from the above equations (1) to (3).

$$V_{DS}' = V_G - V_T + \beta_A/\beta_N \quad (5)$$

Thus, when the term $\beta_A/\beta_N$ for the gate voltage proportional component increases, the observed value of the voltage $V_{DS}'$ becomes large.

Figure 5:
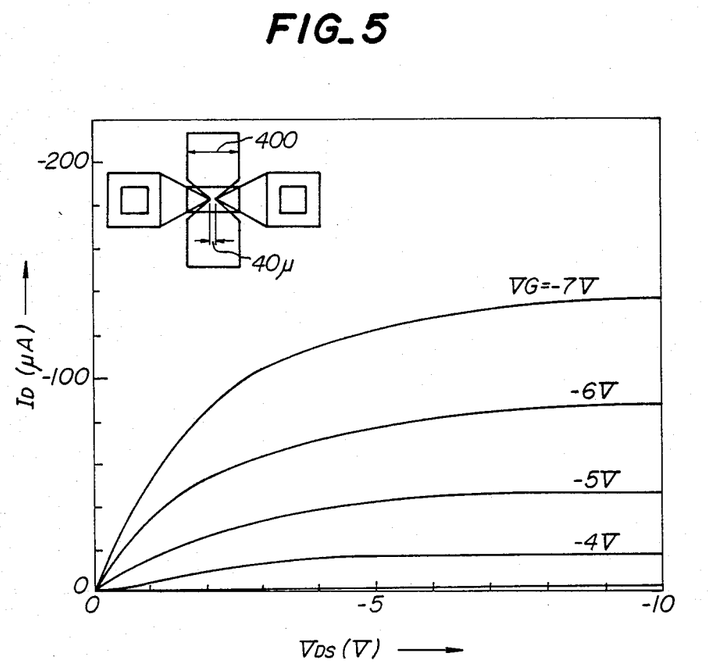
FIGS. 5 and 6 are graphs indicating the diffusion current injection effect.

The result of tests which prove the above-mentioned effects will be described now. FIG. 5 shows the voltage-current characteristics of a MOS FET with a gate electrode of wedge shape, which characteristics indicates the diffusion current effects of peripheral carriers. The drain current $I_D$ increases gradually with the source-drain voltage $V_{DS}$, and this gradual increase indicates that the process toward the saturation is slow due to the diffusion of the back gate carriers in the proximity of the grain zone to the pinch-off zone. In other words, the effects of the diffusion current in proportion to the gate voltage contributes greatly.

Figure 6:
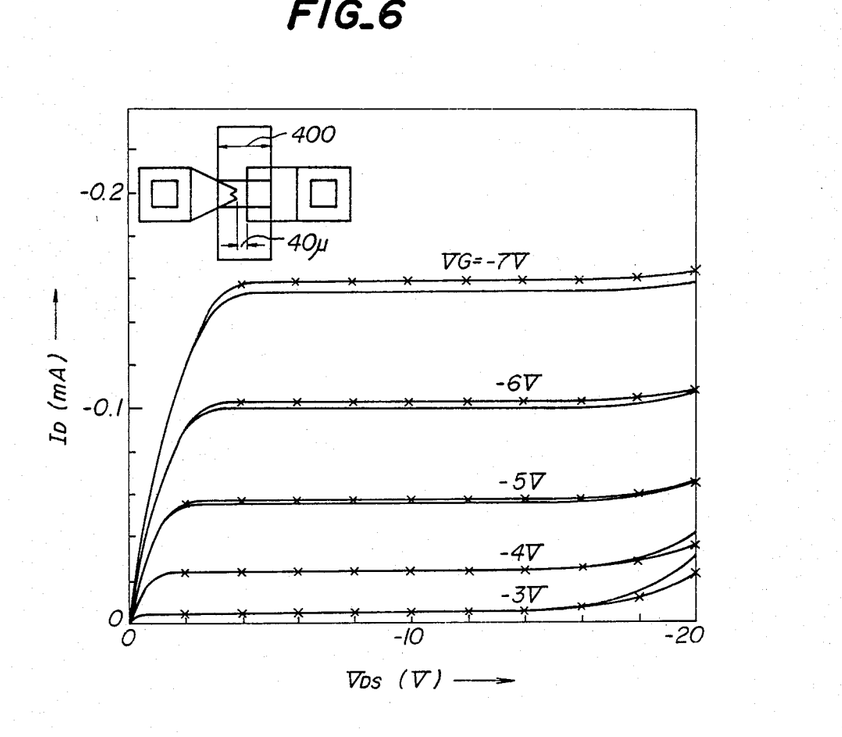

FIG. 6 shows the voltage-current characteristics of a MOS FET in which one of the source zone and drain zone has a tapered portion of wedge shape while the other one of them has a rectangular end facing the diminished edge of the tapered portion. The solid lines without cross marks are for the case in which the source zone has a tapered portion of wedge shape and the drain zone has a rectangular end. The solid lines with cross marks are for the case in which the voltages of the source and drain are reversed and source zone has a rectangular end while drain zone has a tapered portion of wedge shape. As can be seen from FIG. 6, the increase of drain breakdown current is restricted by the increase of the gate voltage. It is noted that, when the drain zone has a rectangular end, the breakdown current increases gradually. As compared with the drain zone having a rectangular end, the drain zone with a wedge-shaped end allows lateral carrier injection into the pinch-off zone and local strong electric field is relieved so as to prevent the breakdown current from sudden increase. The above result suggest the presence of the effect of carrier diffusion injection into the drain pinch off zone.

Figure 7A:
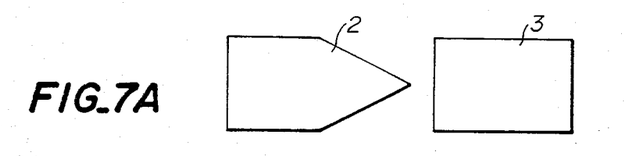
FIGS. 7A through 7E are schematic plan views which show different shapes of the facing ends of the source zone and the drain zone.

FIG. 7A through 7E show schematic plan views of different modifications of the MOS FET device of the invention. Based on the above test results, the shapes of the facing portions of the source zone and the drain zone can be modified as shown in the drawings. For simplicity, only the outlines of the source zone and drain zone are shown in the drawings. FIG. 7A shows a modification in which the drain zone 2 has a tapered portion of wedge shape that faces a rectangular end of the source zone 3. It is also possible that the source zone 3 has a tapered portion of wedge shape that faces a rectangular end of the drain zone 2.

Figure 7B:
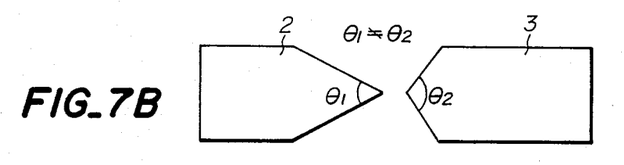
Figure 7C:
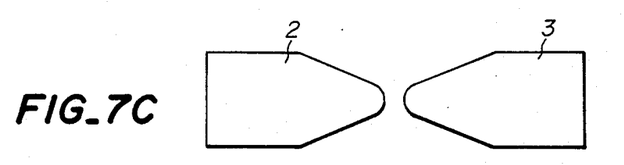
Figure 7D:
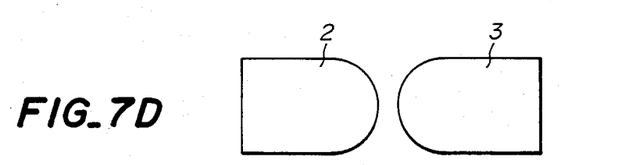
Figure 7E:
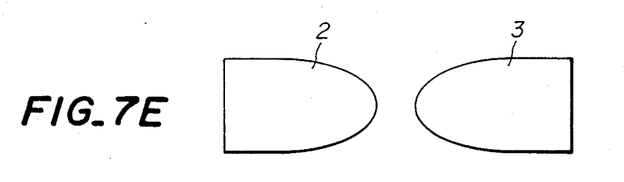

In the arrangement of FIG. 7B both the drain zone 2 and the source zone 3 have tapered portion of wedge shape which face each other, an the vertical angles $\theta_1$ and $\theta_2$ of the drain zone 2 and the source zone 3 are different from each other. In the modification of FIG. 7C both the drain zone 2 and the source zone 3 have tapered portions with round chamfered ends. FIG. 7D shows the drain zone 2 and the source zone 3 which have identical tapered portions of semicircular shape. FIG. 7E illustrates another modification in which both of the drain zone 2 and the source zone 3 have identical tapered portions of semi-elliptic shape.

As shown in FIG. 7A through FIG. 7E, when at least one of the mutually facing portions of the drain zone 2 and the source zone 3 is made into a tapered portion of for instance wedge, semicircular, or semi-elliptic shape, it is possible to achieve the electric field converging effect and the diffusion injection effect. As a result, output drain current proportional to the gate voltage can be obtained.

When a mechanical stress is applied to the drain zone of the MOS FET device of the invention, its output current varies depending on the magnitude of the stress thus applied, so that the MOS FET device is suitable for pressure sensors and strain gauges and the like. In this case, calibration can be carried out simply by changing the gate voltage, and such method of calibration is advantageous in certain applications. Further, the MOS FET device of the invention is also suitable for electromechanical converter elements, such as microphones, accelerometers, and other measuring instruments.

As described in detail in the foregoing, a MOS FET device of the invention uses one or two tapered portions formed on at least either one of the source zone and the drain zone so as to cause the diminished edge of the tapered portion to face the other one of the source zone and the drain zone, so that both the electric field converging effect and the diffusion current injecting effect can be achieved. Consequently, an output drain current which varies linearly with the gate voltage can be produced. When the MOS FET device of the invention is used as an amplifying element of semiconductor sensors, the output current varying linearly with the gate voltage eliminates the need of any linearizing circuits for the output from the MOS FET which circuits are necessary with the conventional MOS FET. Thus, the invention facilitates simplification of the signal treating circuits of sensor devices.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

I claim:

1. A MOS FET device comprising a semiconductor substrate of one conductivity type, a source layer of the other conductivity type formed in the substrate, a drain layer of the other conductivity type formed in the substrate with a gap from the source layer, a drain electrode applied on the drain layer, a channel region being defined in the substrate between said source layer and said drain layer, an insulating film overlying the channel zone, and a gate electrode applied on the insulating film so as to face the channel region via the insulating film, at least one of the source and drain layers having a tapered portion whose diminished edge extends into the channel zone so as to face the other one of the source and drain layers, wherein the diminished edge of said at least one of the source and drain layers is separated from the other one of the source and drain layers by such a gap L that a carrier moving speed in the channel zone is saturated when a sourcedrain voltage higher than a threshold value is applied across the source and drain electrodes.

2. A MOS FET device as set forth in claim 1, wherein said tapered portion is of wedge shape.

3. A MOS FET device as set forth in claim 1, wherein said tapered portion is of semicircular shape.

4. A MOS FET device as set forth in claim 1, wherein said tapered portion is of semi-elliptic shape.

5. A MOS FET device as set forth in claim 1, wherein said other one of the source and drain layers has a rectangular portion which faces said diminished edge of said one of the source zone and the drain layers.

6. A MOS FET device comprising a semiconductor substrate of one conductivity type, a source layer of the other conductivity type formed in the substrate, a drain layer of the other conductivity type formed in the substrate with a gap from the source layer, a drain electrode applied on the drain layer, a channel region being defined in the substrate between said source layer and said drain layer, an insulating film overlying the channel zone, and a gate electrode applied on the insulating film so as to face the channel region via the insulating film, each of the source and drain layers having a tapered portion whose diminished edge extends into the channel zone so as to face the other one of the source and drain layers, the diminished edges of said source and drain layers being aligned so as to face each other, each of the vertical aligned of the tapered portions of said source and drain layers being in a range of 10° to 160°; and the diminished edge of the source layer and the diminished edge of the drain layer being separated by such a gap L that a carrier moving speed in the channel zone is saturated when a source-drain voltage higher than a threshold value is applied across the source and drain electrodes.

7. A MOS FET device as set forth in claim 1, wherein both of the source and the drain layers have said tapered portions with the diminished edges respectively, which diminished edges are aligned so as to face each other.

8. A MOS FET device as set forth in claim 7, wherein the diminished edges of both the source and drain layers are of wedge shape with identical vertical 9. A MOS FET device as set forth in claim 7, wherein the diminished edges of both the source and drain layers are of wedge shape but with different vertical angles.

10. A MOS FET device as set forth in claim 8, wherein each of the vertical angles is in a range of 10° to 160°.

11. A MOS FET device as set forth in claim 9, wherein each of the vertical angles is in a range of 10° to 160°.

* * * * *